US011617270B2

(12) United States Patent
Ciaccio et al.

(10) Patent No.: US 11,617,270 B2
(45) Date of Patent: Mar. 28, 2023

(54) METHOD OF MANUFACTURING A DOUBLE-SIDED LAMINATE INCLUDING DRY MILLING A CONDUCTIVE TRACE PATTERN AND PROVIDING A COVER LAYER WITH PRECUT ACCESS HOLES THAT EXPOSE THE TRACE PATTERN

(71) Applicant: Gentherm Inc., Northville, MI (US)

(72) Inventors: Michael Peter Ciaccio, Chelsea, MI (US); Timothy Hughes, South Lyon, MI (US)

(73) Assignee: Gentherm Incorporated, Northville, MI (US)

( * ) Notice: Subject to any disclaimer, the term of this patent is extended or adjusted under 35 U.S.C. 154(b) by 453 days.

(21) Appl. No.: 16/822,688

(22) Filed: Mar. 18, 2020

(65) Prior Publication Data
US 2021/0092844 A1 Mar. 25, 2021

Related U.S. Application Data

(62) Division of application No. 16/580,193, filed on Sep. 24, 2019, now Pat. No. 10,667,394.

(51) Int. Cl.
*H05K 3/04* (2006.01)
*H05K 1/11* (2006.01)
*H05K 3/40* (2006.01)
*H01P 11/00* (2006.01)

(52) U.S. Cl.
CPC .............. *H05K 3/043* (2013.01); *H01P 11/00* (2013.01); *H01P 11/001* (2013.01); *H01P 11/003* (2013.01); *H05K 1/116* (2013.01); *H05K 3/4038* (2013.01); *H05K 2201/0195* (2013.01)

(58) Field of Classification Search
CPC ....... H01P 11/003; H05K 1/116; H05K 3/043; H05K 2201/0195
USPC .......................................................... 216/52
See application file for complete search history.

(56) References Cited

U.S. PATENT DOCUMENTS

| 4,075,420 | A | 2/1978 | Walton |
| 6,461,527 | B1 | 10/2002 | Haupt et al. |
| 10,667,394 | B1 * | 5/2020 | Ciaccio ................. H05K 1/116 |
| 2008/0254392 | A1 | 10/2008 | Yang |
| 2009/0242253 | A1 | 10/2009 | Muro et al. |
| 2011/0302775 | A1 | 12/2011 | Cai et al. |

(Continued)

FOREIGN PATENT DOCUMENTS

| JP | 2016184596 A | 10/2016 |
| WO | WO-2005027599 A1 | 3/2005 |

OTHER PUBLICATIONS

U.S. Appl. No. 16/580,193, filed Sep. 24, 2019, Ciaccio.

(Continued)

*Primary Examiner* — Benny T Lee

(57) ABSTRACT

A method for manufacturing a double-sided, single conductor laminate includes providing a laminated substrate that includes a conductive layer, an adhesive layer and a support layer; dry milling a trace pattern in the laminated substrate by removing selected areas of the conductive layer and the adhesive layer; and attaching a first cover layer using a first adhesive layer to the conductive layer. The first cover layer includes one or more precut access holes that align with one or more traces of the trace pattern.

21 Claims, 6 Drawing Sheets

(56) References Cited

U.S. PATENT DOCUMENTS

2019/0103203 A1    4/2019  Tan
2019/0148807 A1*   5/2019  Sikina et al. ........... H01P 3/082
                                                        333/238

OTHER PUBLICATIONS

International Search Report and Written Opinion dated Jan. 29, 2021 corresponding to International Application No. PCT/IB2020/060094, 24 pages.

* cited by examiner

METHOD OF MANUFACTURING A DOUBLE-SIDED LAMINATE INCLUDING DRY MILLING A CONDUCTIVE TRACE PATTERN AND PROVIDING A COVER LAYER WITH PRECUT ACCESS HOLES THAT EXPOSE THE TRACE PATTERN

CROSS-REFERENCE TO RELATED APPLICATIONS

The present disclosure is a divisional of U.S. patent application Ser. No. 16/580,193 filed on Sep. 24, 2019 (now U.S. Pat. No. 10,667,394, issued May 26, 2020). The entire disclosure of the application referenced above is incorporated herein by reference.

FIELD

The present disclosure relates to laminated substrates, and more particularly to laminated substrates including a single conductor layer that is dry milled to define trace patterns and that provides access to the conductive layer from both sides.

BACKGROUND

The background description provided here is for the purpose of generally presenting the context of the disclosure. Work of the presently named inventors, to the extent the disclosure is described in this background section, as well as aspects of the description that may not otherwise qualify as prior art at the time of filing, are neither expressly nor impliedly admitted as prior art against the present disclosure.

As electronic systems in vehicles become increasingly complex, an increasing number of devices need to be connected together. In most vehicles, complex wiring harnesses with individual wires are used. The wiring harnesses are prone to failures and are difficult to manufacture.

SUMMARY OF THE INVENTION

A method for manufacturing a double-sided, single conductor laminate includes providing a laminated substrate that includes a conductive layer, an adhesive layer and a support layer; dry milling a trace pattern in the laminated substrate by removing selected areas of the conductive layer and the adhesive layer; and attaching a first cover layer using a first adhesive layer to the conductive layer. The first cover layer includes one or more precut access holes that align with one or more traces of the trace pattern.

In other features, the first cover layer further includes a second adhesive layer on a side thereof opposite to the first adhesive layer. The method includes removing the support layer.

In other features, the method includes thinning the conductive layer using dry milling.

The method includes attaching a second cover layer with a third adhesive layer to the conductive layer. The second cover layer includes a fourth adhesive layer on a side thereof opposite to the third adhesive layer.

In other features, the method includes spraying adhesive layers onto outer surfaces of the laminated substrate. The conductive layer comprises a material selected from a group consisting of copper and aluminum. The support layer comprises a material selected from a group consisting of polyethylene terephthalate (PET), polyethylene naphthalate (PEN), or polyimide (PI). The laminated substrate comprises a continuous web.

A method for manufacturing a double-sided, single conductor laminate includes providing a laminated substrate that includes a conductive layer, an adhesive layer and a support layer; dry milling a trace pattern in the laminated substrate by removing selected areas of the conductive layer and the adhesive layer; and attaching a first cover layer using a first adhesive layer to the conductive layer. The first cover layer includes one or more precut access holes.

In other features, the first cover layer further includes a second adhesive layer on a side thereof to the first adhesive layer. The method includes creating one or more access holes in the support layer to access one or more traces defined by the conductive layer. Creating the access holes includes dry milling the access holes. Creating the access holes includes fly cutting the access holes. Creating the access holes includes laser ablating the access holes.

In other features, the method includes spraying adhesive layers onto outer surfaces of the laminated substrate. The conductive layer comprises a material selected from a group consisting of copper and aluminum. The support layer comprises a material selected from a group consisting of polyethylene terephthalate (PET), polyethylene naphthalate (PEN), or polyimide (PI). The laminated substrate comprises a continuous web.

A double-sided, single conductor laminate includes a conductive layer including a trace pattern including a plurality of traces. A first cover layer includes one or more access holes to access one or more of the plurality of traces. A first adhesive layer attaches the first cover layer to one side of the conductive layer. A second cover layer includes access holes to access one or more of the plurality of traces. A second adhesive layer attaches the second cover layer to an opposite side of the conductive layer.

In other features, the first cover layer further includes a third adhesive layer on an opposite side thereof. The second cover layer includes a fourth adhesive layer on an opposite side thereof. The conductive layer comprises a material selected from a group consisting of copper and aluminum.

A double-sided, single conductor laminate includes a conductive layer including a trace pattern including a plurality of traces. A first cover layer includes one or more access holes to access one or more of the plurality of traces. A first adhesive layer attaches the first cover layer to the conductive layer. A support layer includes one or more access holes to access one or more of the plurality of traces. A second adhesive layer attaches the support layer to the conductive layer.

In other features, the first cover layer further includes a third adhesive layer on a side thereof opposite to the first adhesive layer. The support layer includes a fourth adhesive layer on a side thereof opposite to the third adhesive layer. The conductive layer comprises a material selected from a group consisting of copper and aluminum. The support layer comprises a material selected from a group consisting of polyethylene terephthalate (PET), polyethylene naphthalate (PEN), or polyimide (PI).

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION OF THE INVENTION

The present disclosure relates to double-sided, single conductor laminates and methods of manufacturing the double-sided, single conductor laminates. As will be described further below, the double-sided, single conductor laminates include trace patterns in a conductive layer and allow connections to be made to both sides of the conductive layer.

Figure 1:
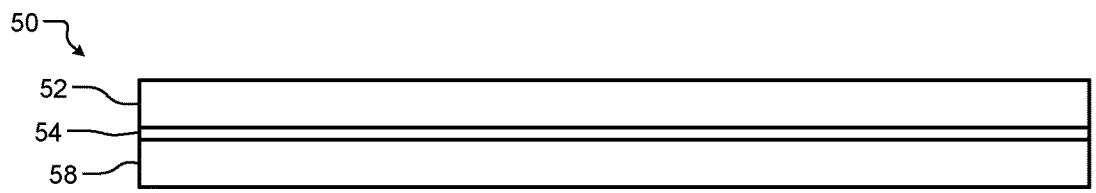
FIG. 1 is a side cross-sectional view of an example of a laminated substrate including a conductive layer, an adhesive layer and a support layer according to the present disclosure.
Figure 2A:
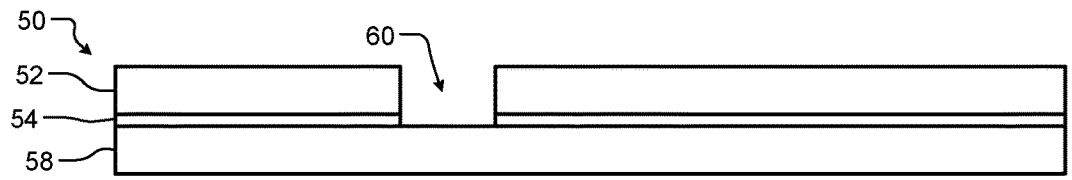
FIG. 2A is a side cross-sectional view of an example of the laminated substrate of FIG. 1 with dry milled, conductive traces defined from a top surface thereof according to the present disclosure.
Figure 2B:
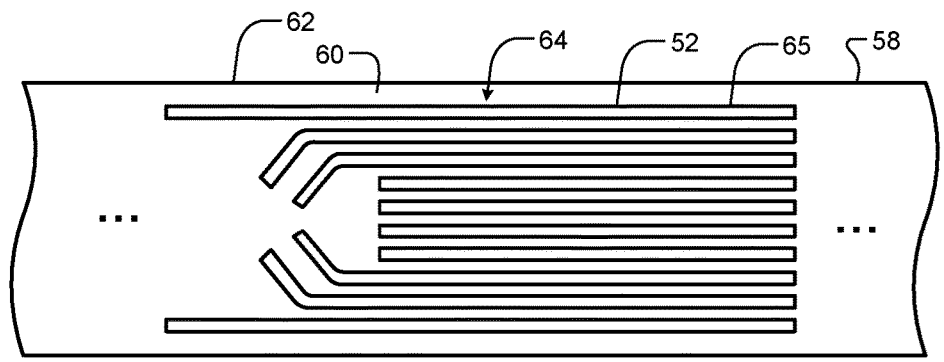
FIG. 2B illustrates an example of a trace pattern that is dry milled in the conductive layer of the laminated substrate.
Figure 3:
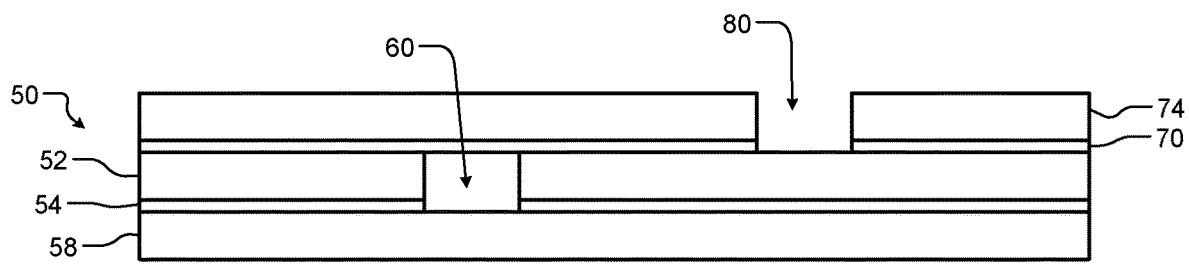
FIG. 3 is a side cross-sectional view of an example of the laminated substrate of FIG. 2A with a cover layer including pre-cut access holes attached to a top surface thereof according to the present disclosure.

Referring now to FIGS. 1, 2A, 2B, and 3, a laminated substrate 50 is shown (FIGS. 1, 2A, and 3). The laminated substrate 50 includes a conductive layer 52 attached by an adhesive layer 54 to a support layer 58 (FIGS. 1, 2A, and 3). In some examples, the support layer 58 is a flexible layer. In some examples, the support layer includes polyethylene terephthalate (PET), polyethylene naphthalate (PEN), or polyimide (PI) layer, although other types of support layers can be used. In some examples, the conductive layer 52 includes copper, aluminum or other conductive material.

In FIG. 2A, the conductive layer 52 of the laminated substrate 50 of FIG. 1 is dry milled to define one or more trace patterns from a top surface thereof. In other words, material of the conductive layer is removed at 60 between traces of the trace patterns to electrically isolate the respective traces of the trace pattern. In some locations, portions of the conductive layer 52 and/or the adhesive layer 54 on one side are removed (e.g. at 60) using the dry milling process to create the trace patterns.

A suitable example of a dry milling process is shown and described in U.S. Pat. No. 7,919,027, issued on Apr. 5, 2011 and entitled "Methods and Devices for Manufacturing of Electrical Components and Laminated Structures", which is hereby incorporated herein by reference in its entirety.

During dry milling, a web of the laminated structure 50 is fed between a milling wheel and a cliché. The cliché includes a pattern with raised and non-raised portions. The raised portions of the pattern push the laminated structure into the milling wheel in regions adjacent to the raised portions. The non-raised portions are not milled. The non-raised portions of the pattern define the traces in the conductive layer. The raised portions of the pattern define regions between the traces where the conductive layer is removed.

In FIG. 2B, the laminate substrate 50 is shown as a continuous web 62. A trace pattern 64 includes a plurality of traces 65 with removed portions 60 located therebetween to electrically isolate the plurality of traces 65. The trace pattern 64 can be repeated lengthwise or laterally on the continuous web 62.

In FIG. 3, a cover layer 74 and an adhesive layer 70 including one or more pre-cut access holes 80 are aligned to the laminated structure or web and attached to a top surface of the laminated substrate 50. In some examples, the access holes 80 are aligned with the traces. The cover layer 74 can include single-sided adhesive (as shown in FIG. 4A) or double-sided adhesive (as shown by adhesive layer 78 in FIG. 4B).

Figure 4A:
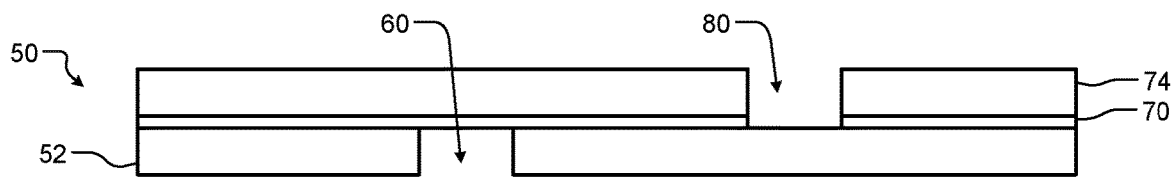
FIG. 4A is a side cross-sectional view of an example of the laminated substrate of FIG. 3 with the support layer and the adhesive layer removed according to the present disclosure.
Figure 4B:
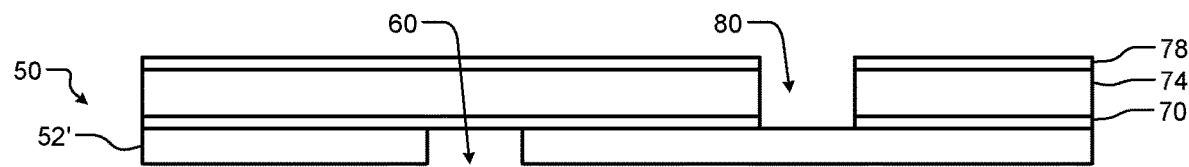
FIG. 4B is a side cross-sectional view of an example of the laminated substrate of FIG. 3 with the support layer and the adhesive layer removed and a thickness of the conductive layer dry milled according to the present disclosure.

Referring now to FIGS. 4A and 4B, additional processing of the laminate substrate 50 is shown. In FIG. 4A, the adhesive layer 54 and the support layer 58 are removed. In FIG. 4B, the adhesive layer 54 and the support layer 58 are removed and thus are not shown in FIG. 4A and a portion of a thickness of the conductive layer 52 (FIG. 4A) is also removed (and thus also not shown in FIG. 4A) using dry milling to create a thinned conductive layer 52'.

Figure 5A:
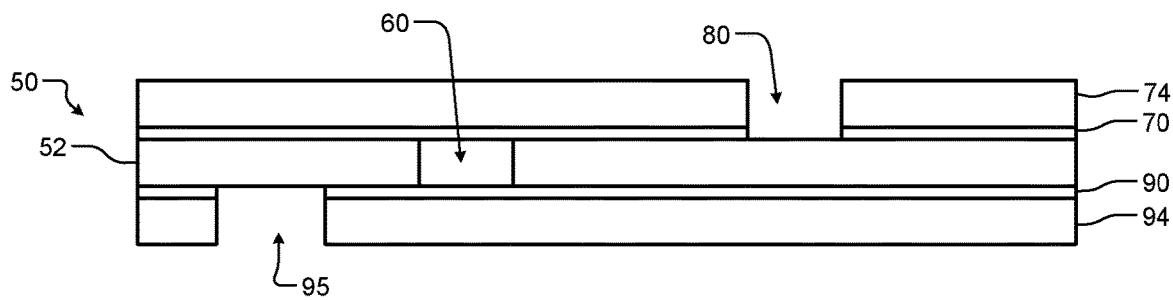
FIGS. 5A and 5B are side cross-sectional views of examples of the laminated substrates of FIGS. 4A and 4B, respectively, with a cover layer attached to the bottom surface thereof according to the present disclosure.
Figure 5B:
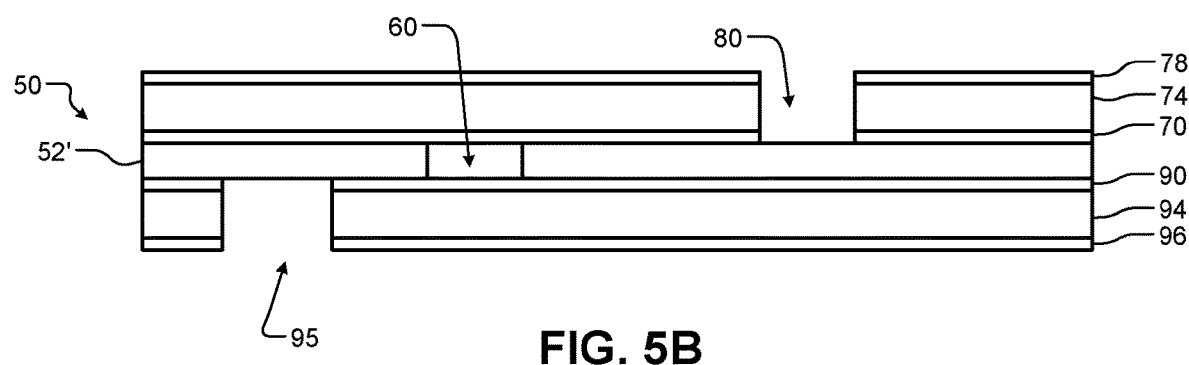

Referring now to FIGS. 5A and 5B, a cover layer 94 including one or more precut access holes 95 is aligned and attached to the conductive layer 52 (FIG. 5A) or the thinned conductive layer 52' (FIG. 5B). In some examples, the access holes 95 are aligned with the traces. In FIG. 5A, the cover layer 94 is aligned and attached by an adhesive layer 90 to the bottom surface of the conductive layer 52. In FIG. 5B, the cover layer 94 is aligned and attached by an adhesive layer 90 to the bottom surface of the thinned conductive layer 52'. The cover layer 94 can include single-sided adhesive (as shown in FIG. 4A) or double-sided adhesive (as shown by adhesive layer 96 in FIG. 5B).

Figure 6:
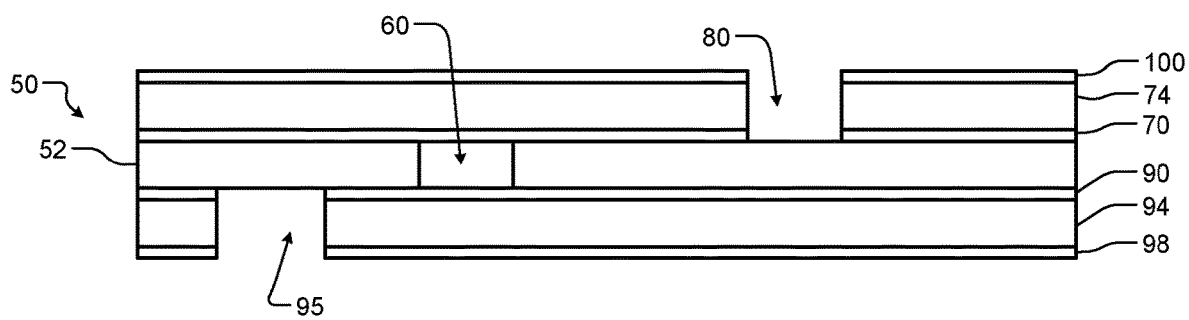
FIG. 6 is a side cross-sectional view of an example of the laminated substrates of FIG. 5A with adhesive layers on outer surfaces thereof according to the present disclosure.

Referring now to FIG. 6, if single-sided cover layers 74 and 94 are used, adhesive layers 98 and 100 can be sprayed or coated onto outer surfaces of the cover layers 74 and 94.

Figure 7:
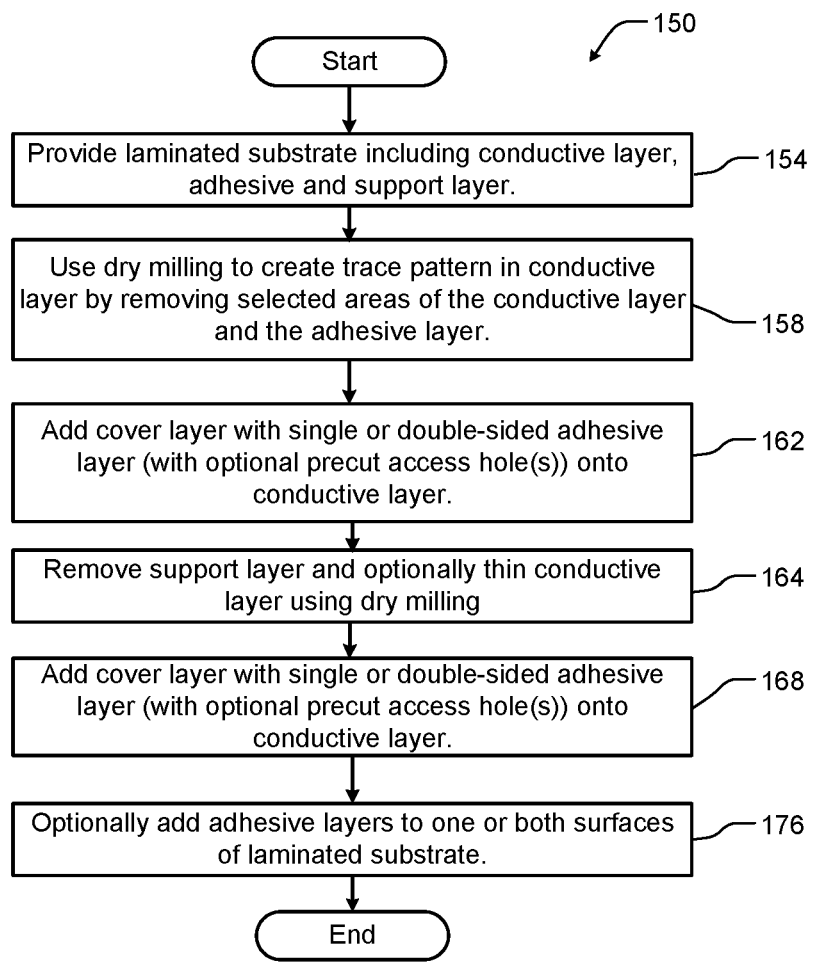
FIG. 7 is a flowchart of an example of a method for fabricating the laminated substrate of FIGS. 1 to 6B according to the present disclosure.

Referring now to FIG. 7, a method 150 for fabricating the laminated substrate of FIGS. 1, 2A, 2B, 3, 4A, 4B, 5A, 5B, and 6 according. The method 150 begins at the block labeled as Start in FIG. 7. At step 154, a laminated substrate is provided and includes a conductive layer, an adhesive layer and a support layer. At step 158, dry milling is used to create trace patterns by removing selected areas of the conductive layer and the adhesive layer.

At step 162, a first cover layer with single or double-sided adhesive is aligned and attached to the conductive layer. The first cover layer may optionally include one or more precut access holes. At step 164, the support layer is removed and the conductive layer is optionally thinned using dry milling.

At step 168, a second cover layer is aligned and attached to the conductive layer with a single or double-sided adhesive layer. At step 176, adhesive (with optional pre-cut access holes) is optionally sprayed or coated onto one or both surfaces of the laminated substrate. For example, the adhesive can be sprayed or coated onto one or both surfaces of the laminated substrate if double-sided adhesive is not used. The method 150 ends at the block labeled as End in FIG. 7.

Figure 8:
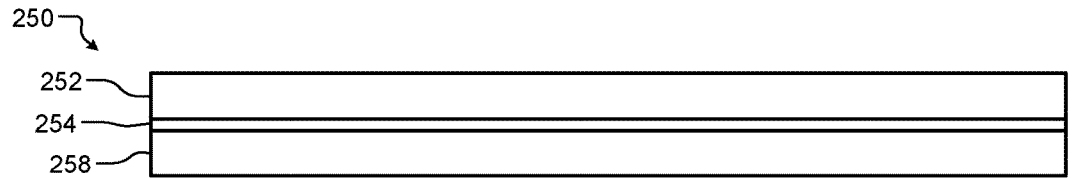
FIG. 8 is a side cross-sectional view of an example of a laminated substrate including a conductive layer, an adhesive layer and a support layer according to the present disclosure.
Figure 9:
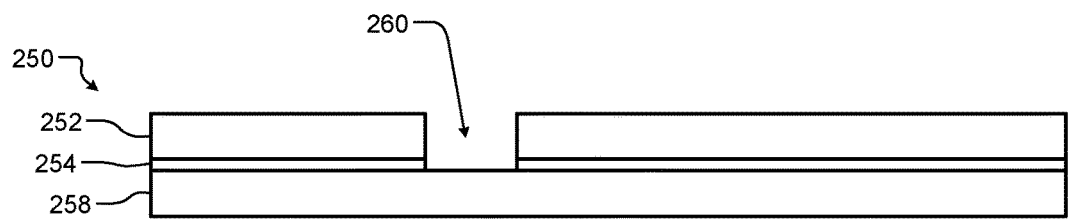
FIG. 9 is a side cross-sectional view of an example of the laminated substrate of FIG. 8 with dry milled traces defined in the conductive layer from a top surface thereof according to the present disclosure.
Figure 10:
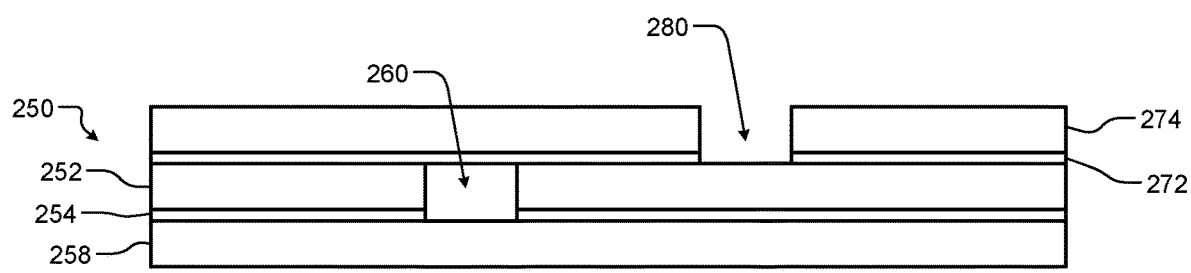
FIG. 10 is a side cross-sectional view of an example of the laminated substrate of FIG. 9 with an adhesive layer and a cover layer with pre-cut access holes attached to a top surface thereof according to the present disclosure.

Referring now to FIGS. 8-10, a laminated substrate 250 is shown. The laminated substrate 250 includes a conductive layer 252 attached by an adhesive layer 254 to a support layer 258. In some examples, the support layer 258 is a flexible layer. In some examples, the support layer includes polyethylene terephthalate (PET), polyethylene naphthalate (PEN), or polyimide (PI) layer, although other types of support layers can be used. In some examples, the conductive layer 52 includes copper, aluminum or other conductive material.

In FIG. 9, the conductive layer 252 of the laminated substrate 250 of FIG. 8 is dry milled to define one or more trace patterns. In some locations, portions of the conductive layer 252 and/or the adhesive layer 254 on one side are removed (e.g. at 260) using the dry milling process to define the trace patterns.

In FIG. 10, a cover layer 274 and an adhesive layer 272 are aligned and attached to a top surface of the laminated substrate 250. The cover layer 274 can include pre-cut access holes 280. The cover layer 274 can include single-sided adhesive (as shown in FIG. 9) or double-sided adhesive as shown in FIGS. 4B and 5B.

Figure 11:
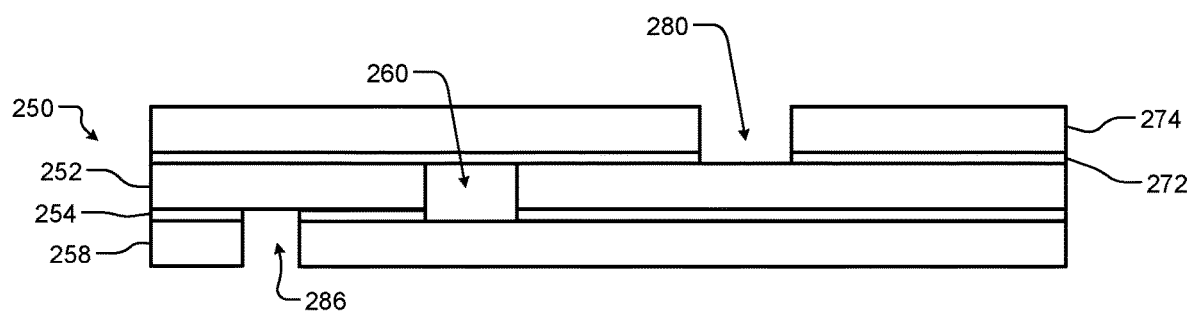
FIG. 11 is a side cross-sectional view of an example of the laminated substrate of FIG. 10 with access holes fly cut or dry milled into the support layer according to the present disclosure.

Referring now to FIG. 11, one or more access holes 286 are created in the support layer 258 to allow bottom-side access to the trace patterns. In some examples, the one or more access holes 286 are fly cut, cliché cut, chemically etched and/or laser ablated. In some examples, a combination of these approaches can be used.

Figure 12:
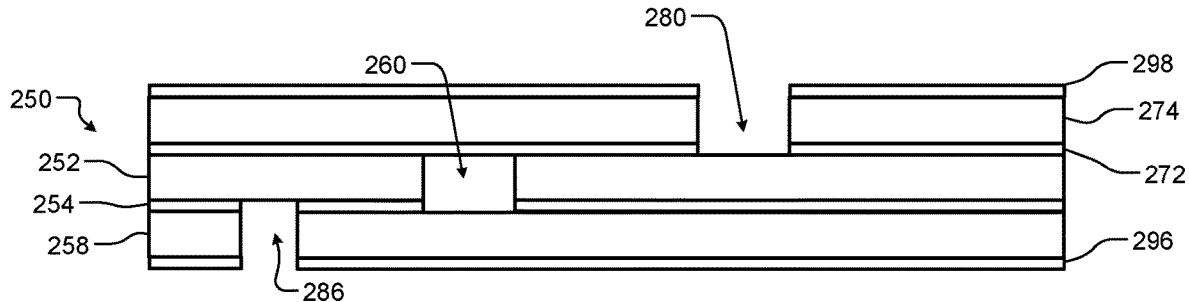
FIG. 12 is a side cross-sectional view of the laminated substrate of FIG. 11 with adhesive layers on outer surfaces thereof.

Referring now to FIG. 12, one or more adhesive layers 296 and 298 can be sprayed onto outer surfaces of the laminated structure 250. For example, the adhesive layers 296 and 298 can be sprayed onto the outer surfaces of the laminated structure 250 when the cover layer includes single-sided adhesive rather than double-sided adhesive.

Figure 13:
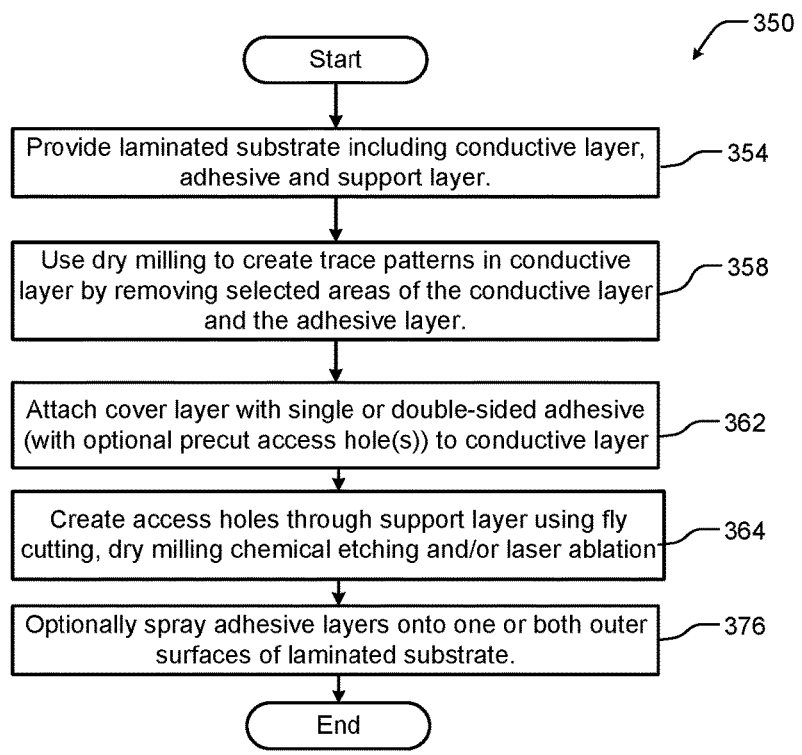
FIG. 13 is a flowchart of an example of a method for fabricating the laminated substrate of FIGS. 8 to 12 according to the present disclosure.

Referring now to FIG. 13, a method 350 for fabricating the laminated substrate of FIGS. 8 to 12 is shown. The method 350 begins at the block labeled as Start in FIG. 13. At step 354, a laminated substrate is provided and includes a conductive layer, an adhesive layer and a support layer. At step 358, dry milling is used to create trace patterns by removing selected areas of the conductive layer and the adhesive layer.

At step 362, a cover layer is aligned and attached to the conductive layer with single or double-sided adhesive. The cover layer may optionally include one or more precut access holes. At step 364, access holes are cut into the support layer using fly cutting, dry milling, chemical etching and/or laser ablation. At step 376, adhesive is optionally sprayed onto one or both surfaces of the laminated substrate. For example, the adhesive can be sprayed onto one or both surfaces of the laminated substrate if double-sided adhesive is not used. The method 350 ends at the block labeled as End in FIG. 13.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a viewing of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

What is claimed is:

1. Method for manufacturing a double-sided, single conductor laminate, comprising:
   providing a laminated substrate that includes a conductive layer, an adhesive layer and a support layer;
   dry miffing a trace pattern in the laminated substrate by removing selected areas of the conductive layer and the adhesive layer; and
   attaching a first cover layer using a first adhesive layer to the conductive layer,
   wherein the first cover layer includes one or more precut access holes that align with one or more traces of the trace pattern.

2. The method of claim 1, wherein the first cover layer further includes a second adhesive layer on a side thereof opposite to the first adhesive layer.

3. The method of claim 1, further comprising removing the support layer.

4. The method of claim 3, further comprising thinning the conductive layer using dry milling.

5. The method of claim 3, further comprising attaching a second cover layer with a third adhesive layer to the conductive layer.

6. The method of claim 5, wherein the second cover layer includes a fourth adhesive layer on a side thereof opposite to the third adhesive layer.

7. The method of claim 5, further comprising spraying adhesive layers onto outer surfaces of the laminated substrate.

8. The method of claim 1, wherein the conductive layer comprises a material selected from a group consisting of copper and aluminum.

9. The method of claim 1, wherein the support layer comprises a material selected from a group consisting of polyethylene terephthalate (PET), polyethylene naphthalate (PEN), or polyimide (PI).

10. The method of claim 1, wherein the laminated substrate comprises a continuous web.

11. The method of claim 1 wherein the dry milling comprises removing the selected areas of the conductive layer and the adhesive layer using a cliché including a pattern with raised portions for pushing the laminated substrate into a milling wheel and non-raised portions for defining the trace pattern.

12. A method for manufacturing a double-sided, single conductor laminate, comprising:
providing a laminated substrate that includes a conductive layer, an adhesive layer and a support layer;
dry milling a trace pattern in the laminated substrate by removing selected areas of the conductive layer and the adhesive layer; and
attaching a first cover layer using a first adhesive layer to the conductive layer,
wherein the first cover layer includes one or more precut access holes.

13. The method of claim 12, further comprising creating one or more access holes in the support layer to access one or more traces defined by the conductive layer.

14. The method of claim 13, wherein creating the access holes in the support layer includes dry milling the access holes.

15. The method of claim 13, wherein creating the access holes in the support layer includes fly cutting the access holes.

16. The method of claim 13, wherein creating the access holes in the support layer includes laser ablating the access holes.

17. The method of claim 12, further comprising spraying adhesive layers onto outer surfaces of the laminated substrate.

18. The method of claim 12, wherein the conductive layer comprises a material selected from a group consisting of copper and aluminum.

19. The method of claim 12, wherein the support layer comprises a material selected from a group consisting of polyethylene terephthalate (PET), polyethylene naphthalate (PEN), or polyimide (PI).

20. The method of claim 12, wherein the laminated substrate comprises a continuous web.

21. The method of claim 12, wherein the first cover layer further includes a second adhesive layer on a side thereof to the first adhesive layer.

* * * * *